(12) United States Patent
D'Ambra

(10) Patent No.: US 6,647,351 B2
(45) Date of Patent: Nov. 11, 2003

(54) METHOD OF DETECTING THE POSITION OF AN INNER SURFACE OF A WORKPIECE ON A MACHINE TOOL, AND MACHINE TOOL IMPLEMENTING SUCH A METHOD

(75) Inventor: Maurizio D'Ambra, Forio (IT)

(73) Assignee: Fiatavio S.p.A., Turin (IT)

(*) Notice: Subject to any disclaimer, the term of this patent is extended or adjusted under 35 U.S.C. 154(b) by 0 days.

(21) Appl. No.: 10/103,984

(22) Filed: Mar. 22, 2002

(65) Prior Publication Data
US 2003/0033111 A1 Feb. 13, 2003

(30) Foreign Application Priority Data
Mar. 23, 2001 (IT) .................... TO2001A0280

(51) Int. Cl.[7] .................... B23Q 17/22; G05B 19/18; G06F 15/00
(52) U.S. Cl. .................... 702/150; 33/520; 340/870.04; 250/231.16; 700/186
(58) Field of Search .................... 702/150; 33/520, 33/644; 340/870.04, 870.07, 686.5; 250/231.16; 700/186, 188

(56) References Cited

U.S. PATENT DOCUMENTS

| 4,401,930 A | * | 8/1983 | Kato et al. .................... 318/603 |
| 5,299,360 A | * | 4/1994 | Possati et al. .................... 33/559 |
| 5,777,562 A | * | 7/1998 | Hoffman .................... 340/870.07 |

* cited by examiner

*Primary Examiner*—Kamini Shah
(74) *Attorney, Agent, or Firm*—Pennie & Edmonds LLP

(57) ABSTRACT

The position of the inner surface of a hollow metal workpiece on a machine tool is detected by connecting an operating member of the machine, preferably a tool, to a first terminal of an electric power source; connecting the inner surface to a second terminal of the power source; moving the operating member gradually towards the inner surface to detect the emission of a signal generated by an emitting device interposed between one of the terminals and the inner surface, and corresponding to a condition in which initial contact is established between the operating member and the inner surface; and determining the position of the operating member at the instant the signal is emitted.

12 Claims, 1 Drawing Sheet

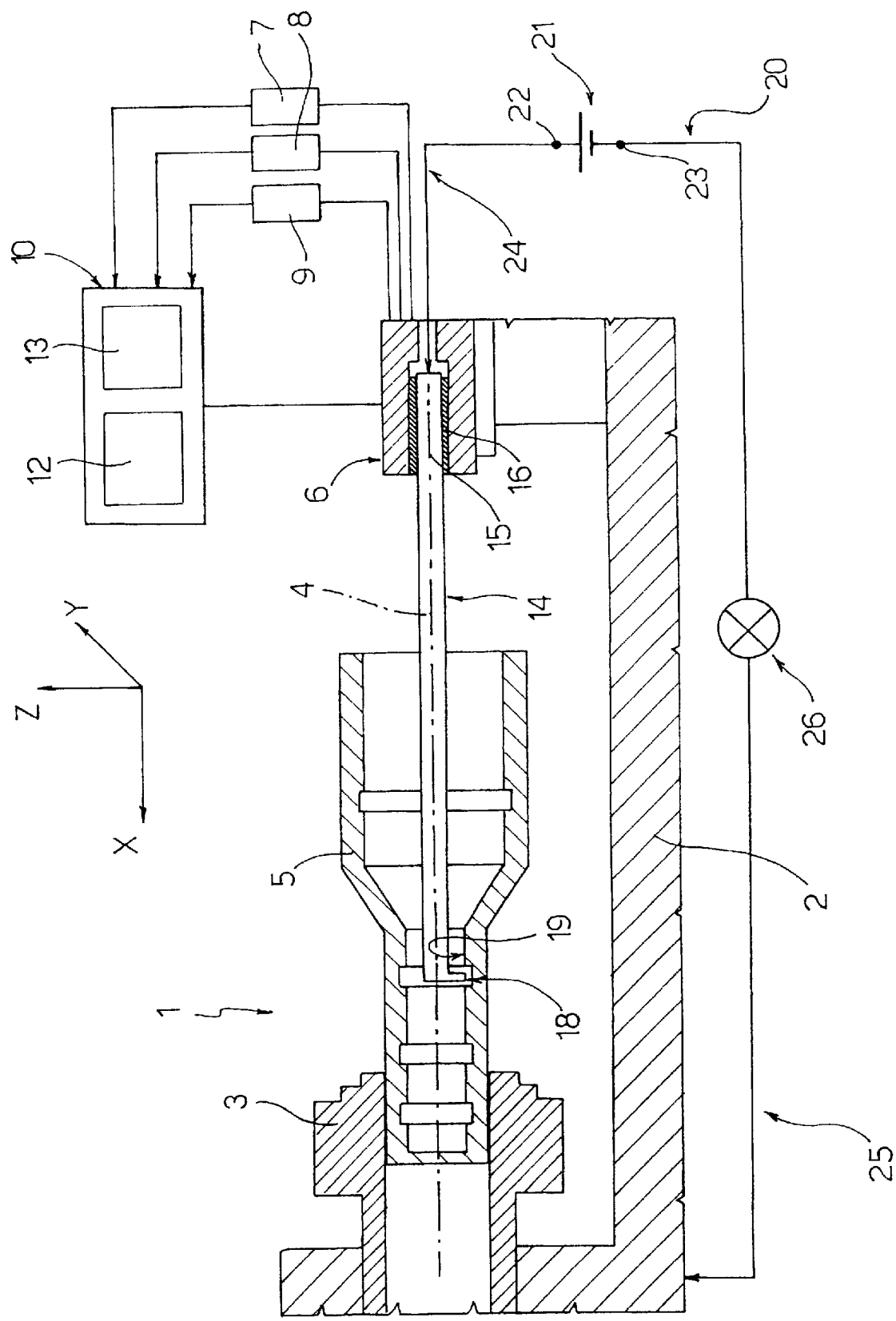

METHOD OF DETECTING THE POSITION OF AN INNER SURFACE OF A WORKPIECE ON A MACHINE TOOL, AND MACHINE TOOL IMPLEMENTING SUCH A METHOD

The present invention relates to a method of detecting the position of an inner surface of a piece for machining or measurement on a machine tool. More specifically, the present invention may be used to advantage, though not exclusively, for detecting the position of inner surfaces of dead and/or particularly long hollow bodies whose inner surfaces are practically invisible from the outside and difficult to measure or detect using known equipment.

BACKGROUND OF THE INVENTION

When machining hollow pieces of the above type, the exact position of the inner surface must be known to set the tool to a zero position in which the cutting edge of the tool skims the inner surface, and which is used as a reference for various internal machining operations, such as boring, face machining dead seats or shoulders, or for making measurements.

At present, zero positioning of the tool is performed manually by the operator easing the tool into contact with the inner surface for machining. Depending as it does on the skill and sensitivity of the operator, such a method obviously involves macroscopic errors which are unacceptable in finish machining operations and, in general, in any operation involving the removal of minute amounts of material, and conformance with strict machining tolerances, normally in the region of a hundredth of a millimeter.

SUMMARY OF THE INVENTION

It is an object of the present invention to provide a method of detecting the position of an inner surface of a workpiece on a machine tool, designed to provide a straightforward, low-cost solution to the above problem.

According to the present invention, there is provided a method of detecting the position of the inner surface of a hollow metal workpiece on a machine tool; the method comprising the steps of inserting an operating member of the machine inside said hollow workpiece, and moving the operating member gradually towards said inner surface; and being characterized by connecting to a first terminal of an electric power source a metal portion of said operating member, which is to be brought into contact with said inner surface; connecting said inner surface to a second terminal of said power source; determining the instant of emission of a signal generated by emitting means interposed between one of said terminals and one of said operating member and said inner surface, and corresponding to a condition in which initial contact is established between the operating member and said inner surface; and determining the position of said operating member at said instant of emission.

The present invention also relates to a chip-forming machine tool.

According to the present invention, there is provided a chip-forming machine tool comprising a bed; retaining means for retaining a hollow metal workpiece defined by an inner surface; an operating member having at least one metal portion for at least contacting said inner surface; and actuating means for moving said operating member to and from said inner surface; characterized by also comprising an electric power source having a first and a second terminal; first electric connecting means interposed between said first terminal and the metal portion of said operating member; second electric connecting means interposed between said second terminal and said inner surface; emitting means interposed between one of said terminals and one of said operating member and said inner surface, and for emitting a signal the instant initial contact is established between the operating member and said inner surface; and display means for indicating the position of said operating member at said instant of contact.

BRIEF DESCRIPTION OF THE DRAWING

The invention will be described with reference to the accompanying drawing, which shows a schematic section of a preferred, non-limiting embodiment of a chip-forming machine tool in accordance with the teachings of the present invention.

DETAILED DESCRIPTION OF THE INVENTION

Number 1 in the accompanying drawing indicates as a whole a chip-forming machine tool comprising a bed 2; and a gripping head 3 connected to bed 2 to rotate about a horizontal axis 4, and for retaining in known manner a hollow metal workpiece 5 to be machined internally.

Machine 1 also comprises a tool turret 6 connected in known manner to bed 2 and movable with respect to bed 2 in three perpendicular directions X, Y and Z. In the example described, displacement of turret 6 in said directions is determined by means of known position detecting devices, e.g. optical scales, indicated 7, 8 and 9 respectively, and which are connected to a control unit 10 of machine 1 comprising a display device 12 and a memory 13 for respectively displaying and memorizing the position of turret 6 in directions X, Y and Z.

Turret 6 is fitted integrally with a tool 14—in the example shown, a reamer—the shank 15 of which is fitted to turret 6 with the interposition of electrically insulating material 16, and the cutting edge 18 of which is housed inside workpiece 5 to machine an inner surface 19 of workpiece 5.

Tool 14 forms part of a device 20 for detecting the position of inner surface 19. Device 20 comprises an electric power source 21—preferably a low-voltage, direct-current source—in turn comprising a first and a second output terminal 22 and 23; terminal 22 is connected electrically by a first cable 24 to tool 14; second terminal 23 is connected electrically to workpiece 5 by an electric connection 25 comprising bed 2 and rotary head 3; and a luminous or acoustic or resistive emitter 26 is interposed between second terminal 23 and bed 2 to emit a relative luminous or acoustic or electric signal to a control unit or servomechanism.

Operation of machine 1 will be described as of a start condition, in which workpiece 5 is fitted to rotary head 3 and coaxial with axis 4, and cutting edge 18 of tool 14 extends outside workpiece 5, e.g. coaxial with axis 4. As of the above condition, an operation is first performed to detect the position of inner surface 19 of workpiece 5, and which comprises the steps of connecting tool 14 and bed 2 to the terminals of electric power source 21; and inserting cutting edge 18 inside workpiece 5, while keeping it at a distance from surface 19, so that no current flows through the electric circuit, and no signal is emitted by emitter 26. At this point, tool 14 is moved gradually in known manner towards surface 19, and, the instant cutting edge 18 contacts surface 19, the electric circuit supplied by source 21 closes and emitter 26 emits a contact-start signal. As soon as the signal is emitted, tool 14 is arrested and its position shown by display 12 of unit 10 and memorized in memory 13 of unit 10 as a zero or reference position. At this point, tool 14 and bed 2 are disconnected from source 21, and surface 19 is machined, e.g. as shown in the accompanying drawings, with reference to the displayed and memorized values.

In the event workpiece 5 has two or more portions defined by respective different inner surfaces, the zero tool position of each portion is detected in the same way as described above, the detected values are memorized, and each portion machined as required.

Device 20 described also provides for quickly and accurately determining the actual internal dimensions of workpiece 5, by simply determining a first and second tool position corresponding to a first and second point of contact with the inner surface as described above, and then working out the difference between the two values to determine the distance between the two points of contact with the inner surface. In this way, the machine is used as an ordinary measuring machine.

As compared with known machines, machine 1 described therefore provides for measuring any dimension and for machining any hollow workpiece and any externally invisible surface to a high degree of dimensional precision. This is mainly due to detecting device 20, which provides for determining the exact instant contact is established between the workpiece and tool, and therefore the position of the tool and corresponding inner surface regardless of the skill and sensitivity of the operator.

As will be clear from the foregoing description, device 20 also provides for accurately determining the tool position upon contact with the workpiece, and therefore the position of the corresponding inner surface, at extremely low cost, by being extremely straightforward both to produce and operate, and completely operator-safe.

Clearly, changes may be made to the device as described without, however, departing from the scope of the present invention.

In particular, detection may be made using an at least partly metallic stylus fitted to the machine in place of or in parallel with tool 14; and terminal 23 may be connected directly to workpiece 5 as opposed to the machine bed 2.

Detection may obviously be made in the same way as described, even in the event the piece for machining/measurement is fixed to the machine bed and the tool is moved with respect to the piece.

The machine tool described may obviously also be used for determining the dimensions and/or relative positions of workpiece inner surfaces which are invisible from the outside and difficult to reach; in which case, the tool is used as a straightforward tracer.

Finally, the tool may be connected to the turret without the interposition of material 16, and a block of electrically insulating material may be interposed between workpiece 5 and bed 2; in which case, terminal 22 would be connected to workpiece 5.

What is claimed is:

1. A method of detecting the position of the inner surface (19) of a hollow metal workpiece (5) on a machine tool or measuring machine (1); the method comprising the steps of inserting an operating member (14) of the machine (1) inside said hollow workpiece (5), and moving the operating member (14) gradually towards said inner surface (19); and being characterized by connecting to a first terminal (22) of an electric power source (21) a metal portion of said operating member (14), which is to be brought into contact with said inner surface (19); connecting said inner surface (19) to a second terminal (23) of said power source (21); determining the instant of emission of a signal generated by emitting means (26) interposed between one (23) of said terminals (22) (23) and one (19) of said operating member (14) and said inner surface (19), and corresponding to a condition in which initial contact is established between the operating member (14) and said inner surface (19); and determining the position of said operating member (14) at said instant of emission.

2. A method as claimed in claim 1, characterized in that the position of said operating member (14) at said instant of emission is determined by arresting the operating member (14) at said instant of emission of said signal.

3. A method as claimed in claim 1, characterized by memorizing said determined position, and using said determined position as a reference for machining the inner surface (19).

4. A method as claimed in claim 1, characterized by moving said operating member (14) inside said workpiece (5) so as to determine two of said positions of the operating member (14); and determining an inner dimension of said workpiece (5) to be machined internally, as a function of the difference between said positions.

5. A chip-forming machine tool (1) comprising a bed (2); retaining means (3) for retaining a hollow metal workpiece (5) defined by an inner surface (19); an operating member (14) having at least one metal portion for at least contacting said inner surface (19); and actuating means (6) for moving said operating member (14) to and from said inner surface (19); characterized by also comprising an electric power source (21) having a first (22) and a second (23) terminal; first electric connecting means (24) interposed between said first terminal (22) and the metal portion of said operating member (14); second electric connecting means (25) interposed between said second terminal (23) and said inner surface (19); emitting means (26) interposed between one (23) of said terminals and one (19) of said operating member (14) and said inner surface (19), and for emitting a signal the instant initial contact is established between the operating member (14) and said inner surface (19); and display means (12) for indicating the position of said operating member (14) at said instant of contact.

6. A machine as claimed in claim 5, characterized by also comprising memory means (13) for memorizing the position of said operating member (14).

7. A machine as claimed in claim 5, characterized in that said operating member (14) is a reamer or face tool.

8. A machine as claimed in claim 5, characterized in that said power source (21) is a low-voltage source.

9. A machine as claimed in claim 5, characterized in that said second electric connecting means (25) comprise at least said retaining means (3).

10. A machine as claimed in claim 9, characterized by comprising electric insulating means (16) interposed between said bed (2) and said operating member (14) or the hollow workpiece.

11. A machine as claimed in claim 5, characterized in that said emitting means (26) are luminous or acoustic emitters.

12. A measuring machine (1) comprising a bed (2); retaining means (3) for retaining a hollow metal workpiece (5) for measurement defined by an inner surface (19); an operating member (14) having at least one metal portion for at least contacting said inner surface (19); and actuating means (6) for moving said operating member (14) to and from said inner surface (19); characterized by also comprising an electric power source (21) having a first (22) and a second (23) terminal; first electric connecting means (24) interposed between said first terminal (22) and the metal portion of said operating member (14); second electric connecting means (25) interposed between said second terminal (23) and said inner surface (19); emitting means (26) interposed between one (23) of said terminals and one (19) of said operating member (14) and said inner surface (19), and for emitting a signal the instant initial contact is established between the operating member (14) and said inner surface (19); and display means (12) for indicating the position of said operating member (14) at said instant of contact.

* * * * *